United States Patent [19]
Hsu et al.

[11] Patent Number: 5,646,435
[45] Date of Patent: Jul. 8, 1997

[54] METHOD FOR FABRICATING CMOS FIELD EFFECT TRANSISTORS HAVING SUB-QUARTER MICROMETER CHANNEL LENGTHS WITH IMPROVED SHORT CHANNEL EFFECT CHARACTERISTICS

[75] Inventors: Charles Ching-Hsiang Hsu; Mong-Song Liang, both of Hsin-Chu, Taiwan

[73] Assignee: Taiwan Semiconductor Manufacturing Company, Ltd., Hsin-Chu, Taiwan

[21] Appl. No.: 416,168

[22] Filed: Apr. 4, 1995

[51] Int. Cl.⁶ .................... H01L 29/76; H01L 21/265
[52] U.S. Cl. ............... 257/382; 257/387; 257/755; 437/41
[58] Field of Search ................... 257/382, 384, 257/387, 412, 755; 437/41, 225

[56] References Cited

U.S. PATENT DOCUMENTS

| | | | |
|---|---|---|---|
| 4,914,500 | 4/1990 | Lin et al. | 257/384 |
| 5,071,780 | 12/1991 | Tsai | 437/41 |
| 5,079,617 | 1/1992 | Yoneda | 257/288 |
| 5,196,357 | 3/1993 | Boardman et al. | 437/40 |
| 5,548,143 | 8/1996 | Lee | 257/402 |

OTHER PUBLICATIONS

"A Sub 0.1 um Grooved Bate MOSFET with High Immunity to Short–Channel Effects" by J. Tanaka et al, IEDM Proceedings, of the IEEE 1993, pp. 537–540, Dec. 1993.

*Primary Examiner*—Mark V. Prenty
*Attorney, Agent, or Firm*—George O. Saile

[57] ABSTRACT

A reverse self-aligned field effect transistor having sub-quarter micrometer (<0.25 um) channel lengths and shallow source/drain junction depths was achieved. The method for fabricating the FET includes a conducting layer that is deposited and patterned over the source/drain areas of the FET. The sub-quarter micrometer channel length was achieved by reducing the channel opening formed in the conducting layer using sidewall spacer techniques. The conducting layer on the substrate and under the source/drain polysilicon layer also serves as an interface to the diffusing source/drain dopants, and shallow junctions are formed that are about 0.06 to 0.08 um depth. The conducting layer also serves as a low resistant ohmic contact to the source/drain areas.

19 Claims, 4 Drawing Sheets

METHOD FOR FABRICATING CMOS FIELD EFFECT TRANSISTORS HAVING SUB-QUARTER MICROMETER CHANNEL LENGTHS WITH IMPROVED SHORT CHANNEL EFFECT CHARACTERISTICS

RELATED PATENT APPLICATION

Serial No. 08/416,167 filed Apr. 4, 1995 entitled A SUB-QUARTER MICROMETER CHANNEL FIELD EFFECT TRANSISTOR HAVING ELEVATED SOURCE/DRAIN AREAS AND LIGHTLY DOPED DRAINS by the same inventor and now U.S. Pat. No. 5,545,579; issued Aug. 13, 1996.

BACKGROUND OF THE INVENTION (1) Field of the Invention

The present invention relates to the fabrication of integrated circuit devices on semiconductor substrates, and more particularly relates to field effect transistors having sub-quarter micrometer channel lengths and improved short channel effect characteristics.

(2) Description of the Prior Art

Dramatic increases in circuit density and circuit performance have occurred in recent years in the semi-conductor industry. These increases are largely due to the reduction in size of the discrete device that make up the circuits. The Field Effect Transistor (FET) having a silicon gate electrode and self-aligned source/drain contact areas is currently the device of choice for Ultra Large Scale Integration (ULSI) because of their very small size, high packing density, low power consumption and high yields.

Conventional FETs are typically fabricated by patterning polysilicon gate electrodes on a single crystal semiconductor substrate having a thin gate oxide therebetween. The gate electrode structure is used as a diffusion barrier mask to form self-aligned source/drain areas in the substrate adjacent to the sides of the gate electrode. The distance from the source junction to drain junction under the gate electrode is defined as the channel length of the FET.

The reduction in size of the FET and their high packing density on the semiconductor substrate is mainly due to advances in the semiconductor technologies, such as high resolution photolithographic techniques and anisotropic plasma etching, to name a few. For example, FETs are currently used in the industry having channel lengths that are less than a half micrometer (0.5 um) in length. If further increases in packing density and increase in device performance are to continue, then it is necessary to further reduce the device size and more particularly, the channel length to sub-quarter micrometer dimensions (that is to less than 0.25 um). However, as this down scaling in device size continues and the channel length is reduced the FET experiences a number of undesirable electrical characteristic known as short channel effects (SCE). These short channel effects become more severe as the device physical dimensions are scaled. This result is due to the fact that the band gap and built in potential at junctions are an intrinsic constant of crystalline material.

These adverse short channel effects result from the electric field distribution in the channel area when the integrated circuit is powered up, which lead to a number of problems. For example, electrons ejected from the drain can acquire sufficient energy to be injected into the gate oxide resulting in charge build up in the gate oxide that causes threshold voltage shifts. Unfortunately, this hot electron effect can degrade device performance after the product is in use (in the field). Another adverse effect is the threshold voltage lowering referred to as threshold voltage roll-off, in which the threshold voltage ($V_{th}$) decreases with decreasing channel length and occurs when the channel length is comparable to the source/drain diffusion depth, a result of reduction of stored charge under the gate region.

To minimize the short channel effects, it is common practice in the semiconductor industry to fabricate FET structures with double diffused drains (DDD) or Lightly Doped Drains (LDD). These DDD of LDD FET structures, having drains with low dopant concentration adjacent to the gate electrodes, modify the electric fields at the drain so as to minimize or eliminate the hot electron and roll-off effects. Method for reducing the junction depth of the source/drain also reduce threshold voltage roll-off.

Another problem occurring with the conventional FET, having a patterned gate electrode, is the inability with the current photolithography techniques to repeatedly and reliably produce sub-quarter micrometer (<0.25 um) wide gate electrode structures.

The reverse self-aligned field effect transistor process as been suggested as an alternative to conventional FETs for forming sub-micrometer gate electrode structures. For example, methods of forming this alternate FET structure are described by W. J. Boardman, et al U.S. Pat. No. 5,196,357 and by N. Tsai, U.S. Pat. No. 5,071,780. A related FET structure entitled "A Sub-0.1-um Grooved Gate MOSFET with High Immunity to Short-Channel Effects", is described by J. Tanaka et al in the IEDM Proceedings of the IEEE, 1993 pages 537–540.

In these reverse self-aligned FET structures a multilayer, having a conducting layer, such as polysilicon, as one of the layers is deposited over the device areas where the FETs are to be built. Openings having vertical sidewalls are etched in the multilayer at locations where the FET gate electrodes are to be formed. A gate oxide and sidewall insulating layers are formed in the opening and a second conducting layer is then deposited and patterned to form the self-aligned overlapping gate electrode. The patterned multilayer and out diffusion of dopant impurities therefrom and into the substrate, serves as the source/drain areas of the FET. However, a number of problem still occur that make manufacturing these FETs difficult, such as forming low resistance contacts to the source/drain areas of the FET and the ability to fabricate shallow source/drain junctions.

There is still, therefore, a strong need in the semiconductor industry for a more controllable and cost effective manufacturing process for forming reverse self-aligned field effect transistor having immunity from short channel effects.

SUMMARY OF THE INVENTION

It is therefore the principle object of this invention to describe a reverse self-aligned field effect transistors structure and a method of fabrication having sub-quarter micrometer channel lengths and shallow diffused source/drain regions in the substrate.

It is another object of this invention to provide reverse self-aligned FET structures having a metal silicide conducting layer to provide a low resistance ohmic contact to the source/drain areas of the FET.

It is still another object of this invention to utilize the metal silicide layer as a diffuser buffer layer for forming shallow junctions in the source/drain areas.

It is still another object of the invention to provide this FET structure by a simple and cost effective manufacturing process.

In accordance with the objects of this invention a method for fabricating improved reverse self-aligned field effect transistors (FETs) having sub-quarter micrometer channel lengths and a resulting structure is described. The method starts by providing a single crystal semiconductor substrate doped with a first conductive type dopant, such as P-type dopant (boron), and having device areas on the substrate surface, surrounded and electrically isolated by field oxide (FOX) areas. A first conducting layer, comprising of a metal silicide, is deposited over the device and field oxide areas. A first polysilicon layer doped with a second conductive type dopant, such as an N-type dopant (arsenic or phosphorus) is deposited on the first conducting layer and then a first insulating is deposited on the first polysilicon layer. The first insulating layer and the first polysilicon layer are patterned using photoresist masking and plasma etching, so as to at least provide opening having vertical sidewalls over the device areas where the gate electrodes are to be formed. The first conducting layer functions as an etch stop layer. The first conducting layer in then etched anisotropically to the semiconductor substrate in the openings. A conformal second insulating layer is then deposited on the first insulating layer and in the openings and blanket etched back to form insulating sidewall spacers in the opening. An ion implantation is done in the openings using a dopant of the first conductive type (e.g. boron) as a channel implant. A gate oxide is thermally grown on the substrate surface in the openings and the substrate is heated to out diffuse the second conductive type dopant (e.g. arsenic or phosphorus) in the first polysilicon layer through the first conducting layer and into the device areas of the substrate, thereby forming shallow source/drain areas. A conformal second polysilicon layer doped with a second conductive type dopant is deposited over the first insulating layer and in the openings. The second polysilicon layer is then patterned leaving portions over the openings, thereby forming the gate electrodes of the reverse self-aligned FETs. A third insulating layer is deposited on the gate electrode and elsewhere on the substrate. Contact openings are etched in the third insulating layer and the first insulating layer to the patterned first polysilicon layer over the source/drain areas. A second conducting layer is then deposited on the third insulating layer and in the contact openings and patterned to define the metal pad contacts, and this thereby completes the reverse self-aligned N-channel FET. By reversing the conductive polarity of the first and second conductive type dopants a P-channel FET can be fabricated in like fashion, and with additional masking and implant steps both P and N-channel FETs can be built on the same substrate for CMOS circuits.

BRIEF DESCRIPTION OF THE DRAWINGS

The object and other advantages of the invention will become more apparent in the preferred embodiment when read in conjunction with the following drawings.

DESCRIPTION OF THE PREFERRED EMBODIMENTS

Referring now to FIGS. 1 through 10 the preferred embodiment is shown for making a new reverse self-aligned field effect transistors (FETs) having sub-quarter micrometer (<0.25 um) channel lengths. The process in described for making N-channel FETs, but it should be well understood by those skilled in the art that P-channel FETs can also be fabricated by reversing the conductive polarity, that is by reversing the dopant types and adjusting appropriately the dopant concentrations. It should also be understood that by including both N and P type well regions in the substrate and by including additional selectively implant steps, that both N and P-channel FETs can be fabricated simultaneously on the same substrate and that Complimentary MOS (CMOS) circuits can be formed therefrom.

Figure 1:
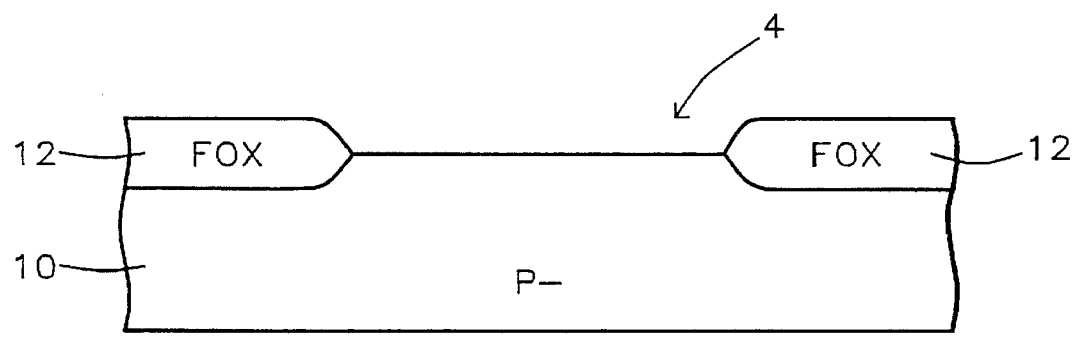
FIGS. 1 through 10, show schematically in cross sectional representation the preferred embodiment of the invention for fabrication N-channel reverse self-aligned field effect transistors.

The process starts by first forming a Field OXide (FOX) region on the substrate separating and electrically isolating device areas whereon and in the reverse self-aligned FETs are to be built. Shown in FIG. 1, is a cross sectional view of a portion of a substrate 10 depicting one of the device area 4 surrounded by a field oxide structure 12. For the N-channel FET, the preferred substrate 10 is typically composed of a P-type doped single crystal silicon with a <100> crystallographic orientation. Alternatively, an N-type doped substrate can be used for making P-channel FETs, but for simplicity of presentation only the N-channel FET is described in this embodiment. The method commonly practiced in the semiconductor industry for forming the field oxide is referred to a as the LOCal Oxidation of Silicon (LOCOS). It consists of using a thin thermal oxide (pad oxide) and a silicon nitride layer on the substrate surface as an oxidation resistant mask (not shown in the Fig.). The desired field oxide regions are etched open in the oxide/nitride layer using conventional photolithographic techniques and then the substrate is subjected to an oxidizing ambient to thermally grow the field oxide 12, as shown in FIG. 1. A typical thickness for the field oxide is between about 4000 to 6000 Angstroms.

The semiconductor devices are then fabricated on the silicon surface in the non-oxidize device areas, after removing the silicon nitride and pad oxide layer using a wet etch. For example, the silicon nitride can be removed in a solution of heated phosphoric acid ($H_3PO_4$) and the thin pad oxide in a dilute hydrofluoric acid solution. The reverse self-aligned FET of this invention having the sub-quarter micrometer channel lengths and the shallow source/drain junctions FET are now formed in the device areas.

Figure 2:
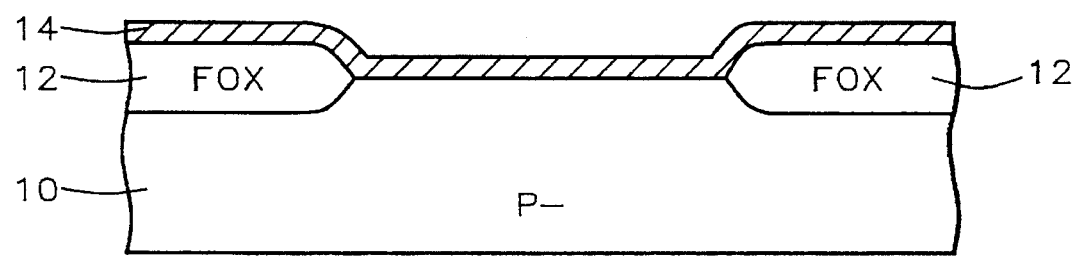

Referring now to FIGS. 2. through 10, the method for fabrication the FET is described in detail. Starting with FIG. 2, a first conducting layer 14 is deposited over the device areas and field oxide areas 12 formed on and in the substrate 10. The first conductive layer 14 is preferably composed of a metal silicide, and more particularly, is composed of cobalt silicide ($CoSi_2$). Alternatively, titanium silicide ($TiSi_2$) can also be used as the first conducting layer 14. The cobalt silicide can be deposited by several means, such as co-evaportion, rf sputtering from a composite target, co-sputtering from two targets. The preferred thickness for the first conducting layer 14, composed of cobalt silicide, is between about 100 and 800 Angstroms, and more specifically is between about 100 and 300 Angstroms.

This metal silicide layer is very important to the invention, as will be seen later in the description, because it functions as a low resistance ohmic contact to the source/drain areas that is self-aligned to the FET channel, and also functions as a dopant diffuser layer for forming the shallow source/drain areas.

Figure 3:
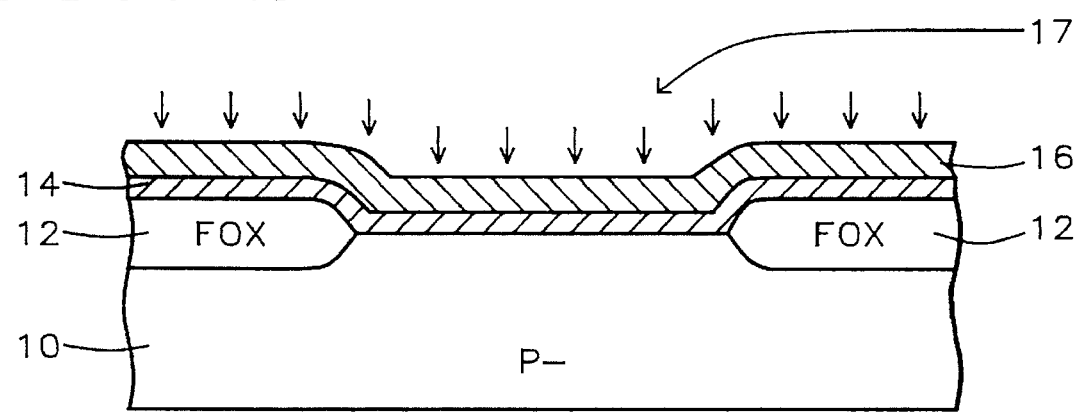

A first polysilicon layer 16 is deposited over the cobalt silicide layer 14 as shown in FIG. 3. The polysilicon layer 16 is preferably deposited at a relatively low temperature. For example, the polysilicon can be deposited by conventional methods, such as plasma enhanced chemical vapor deposition (PECVD) or low pressure chemical vapor deposition (LPCVD) using for example a reactant gas such as silane (SiH$_4$). However, the preferred method of depositing layer 16 for this invention is by low pressure chemical vapor deposition (LPCVD), and at a temperature of about 600° C. The thickness of the polysilicon layer 16 is preferably in the range of between about 1000 to 2000 Angstroms. The layer 16 is then doped with a second conducting type dopant of the N type, such as arsenic (As) or phosphorus (P) by ion implantation, as depicted in FIG. 3 by the vertical arrows 17. Alternatively, the polysilicon layer 16 can be doped in situ during the polysilicon deposition by, for example, adding phosphine (PH$_3$) or arsine (AsH$_3$) to the silane gas. The preferred N dopant concentration in layer 16 is between about 1.0 E 20 to 1.0 E 21 atoms/cm$^3$. This layer will eventually form the polysilicon source/drain pads for the FET from which the N-type dopant will be diffused into the substrate 10 to form shallow source/drain junctions.

Figure 4:
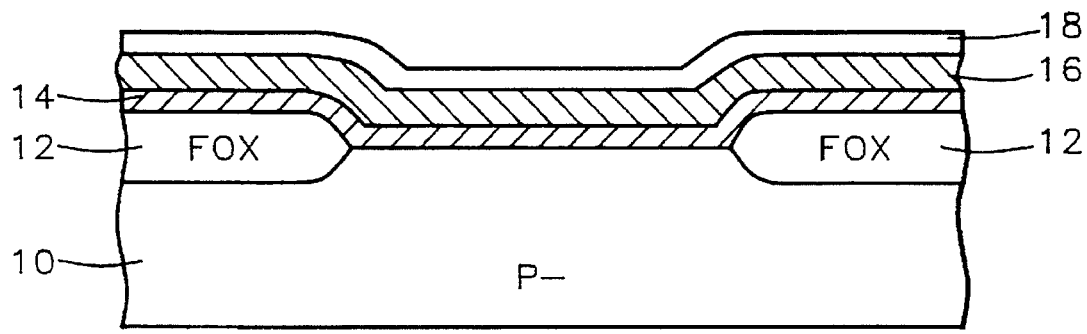

Referring now to FIG. 4, a first insulating layer 18 is deposited over the N doped polysilicon layer 16. The layer 18 serves as an inter-polysilicon oxide (IPO) layer to electrically isolate the source/drain polysilicon layer from the gate electrode that is formed at a later step. The insulating layer 18, for example, can be composed of silicon oxide, and can be deposited at a relatively low temperature by plasma enhanced chemical vapor deposition (PECVD) or alternatively, by atmospheric pressure chemical vapor deposition (APCVD). The oxide is preferably deposited in a PECVD reactor using a gas mixture of silane (SiH$_4$) and nitrous oxide (N$_2$O) or silane and oxygen. The deposition is at a temperature of between about 300° to 400° C. The preferred thickness of layer 18 is between about 500 to 800 Angstroms.

Figure 5:
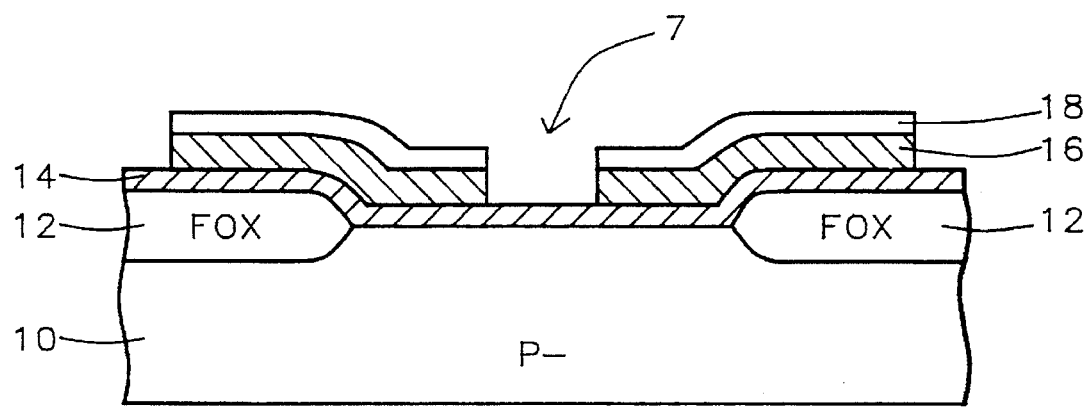

Now as shown in FIGS. 5, conventional photolithographic techniques and anisotropic plasma etching are used to pattern layers 18 and 16 forming portions over the source and the drain areas that overlap the field oxide areas and also have a narrow opening 7 extending over each device area and forming two separate polysilicon portions. The opening 7 having essentially vertical sidewalls will later serve as the sub-quarter micrometer channel region for the FET. FIG. 5 depicts one of the device areas having an opening 7 after the plasma etching and the removal of the photoresist mask. The anisotropic etching, for example, can be performed in a reactive ion etcher or also in a high plasma density etcher having a microwave or transformer coupled plasmas sources. The silicon oxide layer 18 is preferably etched in a reactive ion etcher (RIE) using an etching gas mixture, such as carbon tetrafluoride in a carrier gas of argon (Ar), while the polysilicon layer 16 is preferably etched using a gas mixture containing chlorine, such as chlorine (Cl$_2$) and argon (Ar).

Figure 6:
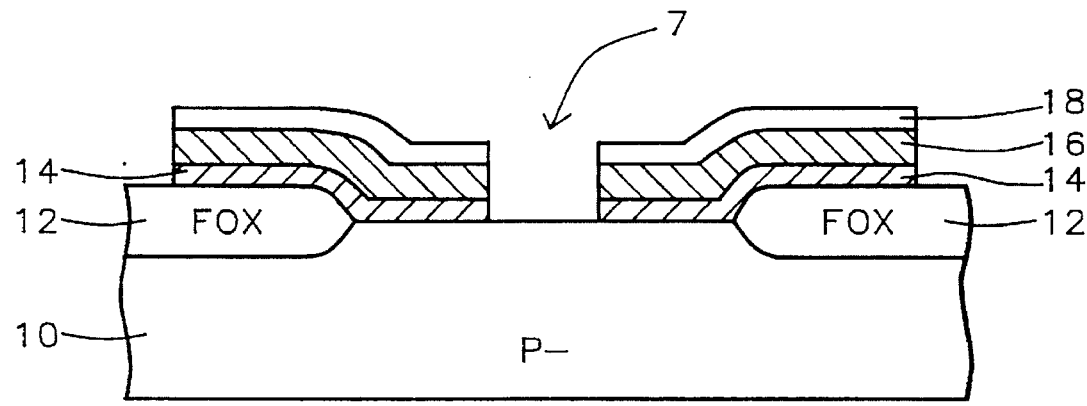

The cobalt silicide (CoSi$_2$) layer 14 exposed in the opening 7 is now etched to the silicon substrate 10 as shown in FIG. 6, for example, the layer 14 can be anisotropically plasma etched using also a etch gas containing chlorine and argon.

Figure 7:
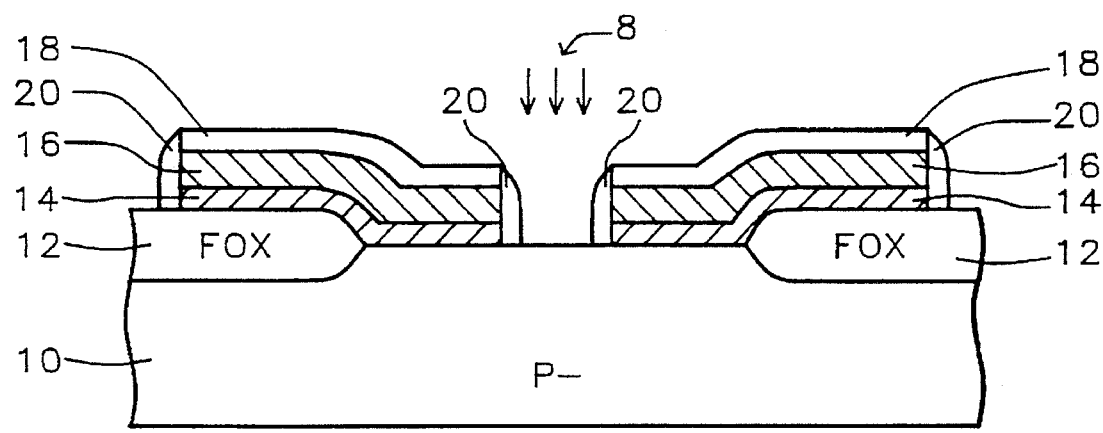

Referring next to FIG. 7, sidewall spacers 20 are formed on the vertical sidewalls of the patterned layers 14, 16 and 18 and provide the important function in opening 7 of reducing the opening 7 to sub-quarter micrometer dimensions. The sidewall spacers 20 are formed by depositing a conformal second insulating layer over the first insulating layer 18, in the opening 7, and elsewhere on the structure of FIG. 6, (the second insulating layer is not shown in the FIG. 7 only the resultant sidewall spacer 20), The second insulating Layer is then anisotropically blanket etching back to the first insulating layer 18 to form the spacers 20, as shown in FIG. 7. The second insulating layer is preferably composed of a silicon oxide (SiO$_2$) or alternatively of silicon nitride (Si$_3$N$_4$). The method of choice for depositing the silicon oxide is by low pressure CVD using, for example, tetraethosiloxane (TEOS) as the reactant gas.

The sidewall spacers 20 provides an important function in the invention by reducing the width of the opening 7, and thereby effectively extending the resolution limit of the current photolithographic technology. By way of example, if the resolution of the photoresist image and plasma etching can reliably form an opening of about 0.25 micrometers (um) in the polysilicon layer 16, then by forming sidewalls having a width of 0.075 micrometers the opening between the sidewalls is reduced in size to about 0.1 micrometers in width. Therefore, since it is easier to control the deposition thickness of the second insulating layer it is easier to accurately reduce the opening 7 to form the sub-quarter micrometer channel length. As a second example, if the opening 7 is designed to be 0.45 um, then sidewall spacer formed from the second insulating layer having a thickness of about 1000 Angstroms (0.1 um) would result in a channel opening of about 0.25 um. Similar examples can be given for other desired sub-0.25 um openings.

Still referring to FIG. 7, a dopant of the first conductive dopant type, for example, boron difluoride ions (BF$_2^+$) can be implanted in the channel opening 7 to adjust the threshold voltage (V$_{th}$) of the N-channel FET that was selected for description in this embodiment. The implant is depicted in FIG. 7 as vertical arrows labeled 8. The implant dose and energy are determined by the device design characteristic for the circuit, such as the required threshold voltage (V$_{th}$), substrate dopant level, gate oxide thickness and gate electrode material. At this step a buried anti-punchthrough implant (not depicted in the FIG. 7), such as B$^{11}$, can also be included to provide punchthrough immunity between source and drain, if required.

Shallow source/drain regions 26 are now formed in the P$^-$ substrate 10 by out-diffusing from the elevated source/drain polysilicon pad structures 16 a dopant of the second conducting type, such phosphorus. The dopant is diffused into the substrate through the cobalt silicide layer 14, which acts as a buffer or diffuser layer. The cobalt silicide layer also serves an important function as a low resistance ohmic contact to the source/drain regions of the substrate 10. The junction depth of the diffused source/drain in substrate 10 is between about 0.06 to 0.08 micrometers below the substrate surface, which significantly reduces the undesirable short channel effects. The source/drains dopant in the substrate 10 also diffuse laterally under the sidewall spacers 20, as shown in FIG. 8, This completes the substrate portion of the FET structure.

The drive-in conditions for forming the shallow source/drain junctions is a 15 to 30 minute heating cycle at a temperature of between about 850° to 900° C. in an inert ambient such as nitrogen.

Figure 8:
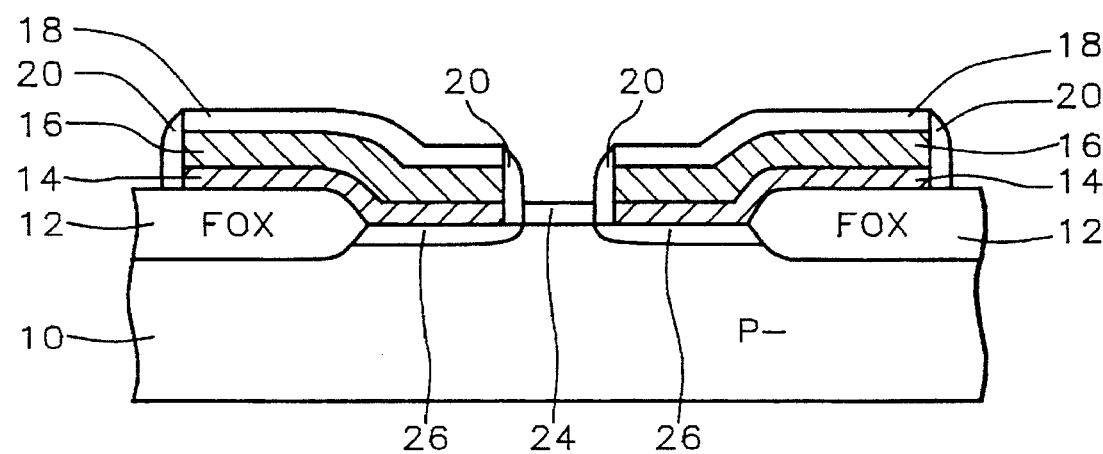

The exposed silicon surface between the spacers 20 in the opening 7 is then carefully cleaned and a thermal oxide is grown to form the gate oxide layer 24, as shown in FIG. 8. The preferred thickness of the gate oxide layer 24 is between about 50 to 80 Angstroms.

Figure 9:
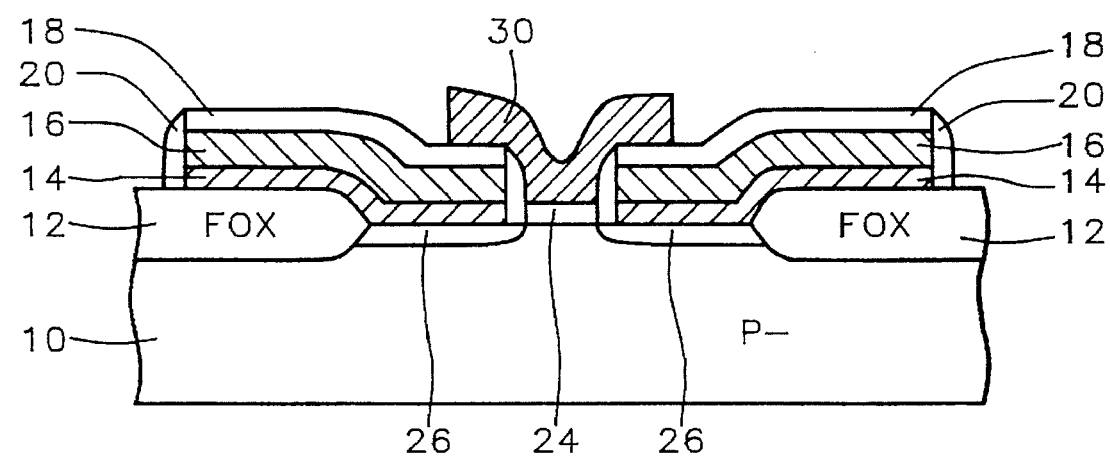

Referring next to FIG. 9, a second polysilicon layer 30 is deposited by chemical vapor deposition means similar to the deposition of the first polysilicon layer 16. The layer is then doped with a dopant of the second conductive type, such as arsenic or phosphorus, the dopant can be introduced into layer 30 either by ion implantation or in situ doping during deposition. The preferred dopant type is arsenic (As), and the preferred ion implant dose is between about 5 E 15 to 1 E 16 atoms/cm$^2$. The preferred thickness of layer 30 is between about 1500 to 2500 Angstroms. The layer 30 is then patterned by conventional photolithographic means and plasma etching to form the self-aligned over-lapping gate electrode 30 over the sub-quarter micrometer wide FET channel region that is formed between the source/drain areas 26 under the gate oxide layer 24, as shown in FIG. 9.

Figure 10:
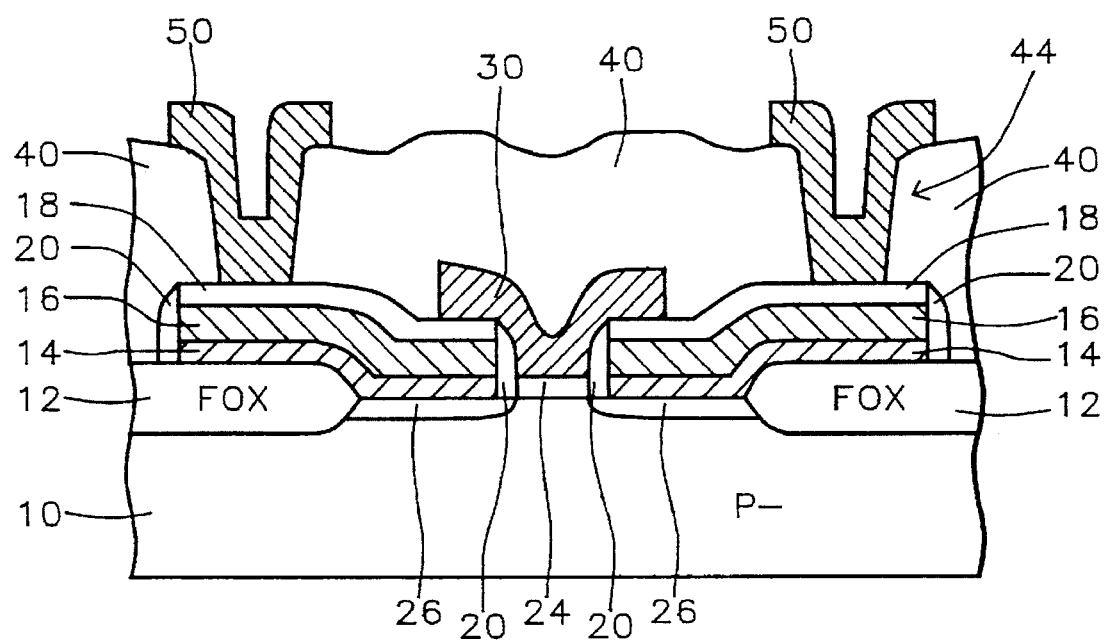

Referring now to FIG. 10, a third insulating layer 40 is deposited over the substrate having the gate electrode structure 30 and the elevated source/drain structures 16. The layer 40 is preferably composed of a CVD silicon oxide or a borophosphosilicate glass (BPSG) having a thickness of between about 6000 to 8000 Angstroms. Source/drain contact openings 44, are etched in the third and first insulating layers 40 and 18 to the elevated portions of the source/drain areas 16. A second conducting layer 50 is deposited over layer 40 and in the contact openings 44, such as a tungsten (W) metal, and then patterned by photoresist masking and etching to from contact metal pads 50, thereby completing the reverse self-aligned FET structure having sub quarter micrometer channel lengths.

While the invention has been particularly shown and described with reference to the preferred embodiments thereof, it will be understood by those skilled in the art that various changes in form and details may be made without departing from the spirit and scope of the invention.

What is claimed is:

1. A method for fabricating reverse self-aligned field effect transistors, comprising the steps of:

providing a semiconductor substrate doped with a first conductive type dopant;

forming field oxide areas on said semiconductor substrate surrounding and electrically isolating device areas;

depositing a first conducting layer on said devices areas and elsewhere on said field oxide areas;

depositing a first polysilicon layer on said first conducting layer, said first polysilicon layer doped with a second conductive type dopant;

depositing a first insulating on said first polysilicon layer;

etching openings having vertical sidewalls in said first insulating layer and said first polysilicon layer to the surface of said first conducting layer, said openings located at least over said device areas and said openings providing for the formation of the gate electrodes of said field effect transistors over said device areas;

etching anisotropically said first conducting layer in said openings to said substrate surface;

depositing a conformal second insulating layer on said first insulating layer and in said openings;

blanket etching back said second insulating layer to said first insulating layer, and thereby forming sidewall spacers on said vertical sidewalls in said openings, and thereby reducing the width of said openings;

implanting in said openings a channel ion implant dopant of said first conductive dopant type;

forming a gate oxide on the surface of said substrate in said openings by thermal oxidation;

heating said substrate and forming doped source/drain areas in portions of said device areas for said transistors by out diffusion of said second conductive dopant type from said first polysilicon layer through said first conductive layer;

depositing a conformal second polysilicon layer on said second insulating layer and in said openings and doped with said second conductive type dopant;

patterning said second polysilicon layer leaving portions over said openings, and thereby forming overlapping gate electrodes for said transistors;

depositing a third insulating layer over said overlapping gate electrodes and over said first insulating layer;

forming contact openings in said third and first insulating layers to said first polysilicon layer, and thereby providing contact means to said source/drain areas;

depositing a second conducting layer on said third insulating layer and in said contact openings;

patterning said second conducting layer, leaving portions over said contact openings, and thereby completing said reverse self-aligned transistors having source/drain areas with said second conducting layer contacts.

2. The method of claim 1, wherein said first conducting layer is composed of cobalt silicide having a thickness of between about 100 to 300 Angstroms.

3. The method of claim 1, wherein the thickness of said first polysilicon layer is between about 1000 to 2000 Angstroma.

4. The method of claim 1, wherein said first insulating layer is composed of silicon oxide having a thickness of between about 500 to 800 Angstroms.

5. The method of claim 1, wherein said first conducting layer is an etch stop for etching said opening in said first polysilicon layer.

6. The method of claim 1, wherein said first conductive layer is composed of titanium silicide ($TiSi_2$) having a thickness of between about 100 to 300 Angstroms.

7. The method of claim 1, wherein said doped source/drain areas in said portions of said device areas have a junction depth of between about 0.06 to 0.08 micrometer.

8. The method of claim 1, wherein the thickness of said second polysilicon layer is between about 1500 to 2500 Angstroms.

9. The method of claim 1, wherein said first conductive dopant type is boron (B) and the second conductive dopant type is phosphorus (P), and said reverse self-aligned field effect transistor is an N-channel FET.

10. The method of claim 1, wherein said first conductive dopant type is arsenic (As) and the second conductive dopant type is boron (B), and said reverse self-aligned field effect transistor is a P-channel FET.

11. A reverse self-aligned field effect transistor, comprising:

a semiconductor substrate doped with a first conductive type dopant;

field oxide areas on said semiconductor substrate surrounding and electrically isolating device areas;

a patterned multilayer structure comprising in increasing elevation from said substrate a first conducting layer, a first polysilicon layer doped with a second conductive type dopant and a first insulating layer, wherein said first conducting layer is composed of cobalt silicide having a thickness of between about 100 and 300 Angstroms;

said patterned multilayer structure having portions larger than and over said device areas and each said portion having an opening with vertical sidewalls, said opening extending across and bisecting said portions of said multilayer structure;

sidewall spacers formed from a second insulating layer on said vertical sidewalls in said openings, and therefore the width between said sidewall spacers is narrower than the width of said openings;

a channel ion implant dopant of said first conductive dopant type in said substrate at exposed areas in said opening, thereby controlling the threshold voltage of said FET;

a gate oxide on the exposed surface of said substrate in said opening;

doped source and drain areas in portions of said device areas under said portion of said multilayer, said source and drain areas formed from out-diffusion of said second conductive dopant type from said first polysilicon layer through said first conductive layer;

a patterned conformal second polysilicon layer over said openings and doped with said second conductive type dopant, and thereby forming an overlapping gate electrode for said FET;

a third insulating layer over said overlapping gate electrodes and multilayer portions having said source/drain areas thereunder;

said third and first insulating layers having contact openings to said multilayer portions thereby providing contact means to said source/drain areas;

a patterned second conducting layer having portions over said contact openings, and thereby providing a completed said reverse self-aligned field effect transistor having said source/drain areas with junction depths between about 0.06 and 0.08 micrometers, said gate electrode and said second conducting layer contacts to said source and drain areas.

12. The field effect transistor of claim 11, wherein the thickness of said first polysilicon layer is between about 1000 to 2000 Angstroms.

13. The field effect transistor of claim 11, wherein the thickness of said second polysilicon layer is between about 1500 to 2500 Angstroms.

14. The field effect transistor of claim 11, wherein said first conductive dopant type is boron (B) and the second conductive dopant type is phosphorus (P), and said reverse self-aligned field effect transistor is an N-channel FET.

15. The field effect transistor of claim 11, wherein said first conductive dopant type is arsenic (As) and the second conductive dopant type is boron (B), and said reverse self-aligned field effect transistor is a P-channel FET.

16. The field effect transistor of claim 11, wherein said spacing between said sidewall spacers in said opening are between about 0.1 to 0.25 micrometers in width.

17. A method for fabricating reverse self-aligned field effect transistors, comprising the steps of:

providing a semiconductor substrate doped with a first conductive type dopant;

forming field oxide areas on said semiconductor substrate surrounding and electrically isolating device areas;

depositing a first conducting layer on said devices areas and elsewhere on said field oxide areas;

depositing a first polysilicon layer on said first conducting layer, said first polysilicon layer doped with a second conductive type dopant and having a thickness between 1000 and 2000 Angstroms;

depositing a first insulating layer having a thickness between 500 and 800 Angstroms on said first polysilicon layer;

etching openings having vertical sidewalls in said first insulating layer and said first polysilicon layer to the surface of said first conducting layer, said openings located at least over said device areas and said openings providing for the formation of the gate electrodes of said field effect transistors over said device areas;

etching anisotropically said first conducting layer in said openings to said substrate surface;

depositing a conformal second insulating layer on said first insulating layer and in said openings;

blanket etching back said second insulating layer to said first insulating layer, and thereby forming sidewall spacers on said vertical sidewalls in said openings, and thereby reducing the width of said openings;

implanting in said openings a channel ion implant dopant of said first conductive dopant type;

forming a gate oxide on the surface of said substrate in said openings by thermal oxidation;

heating said substrate and forming doped source/drain areas in portions of said device areas for said transistors by out diffusion of said second conductive dopant type from said first polysilicon layer through said first conductive layer;

depositing a conformal second polysilicon layer having a thickness between 1500 and 2500 Angstroms on said second insulating layer and in said openings and doped with said second conductive type dopant;

patterning said second polysilicon layer leaving portions over said openings, and thereby forming over-lapping gate electrodes for said transistors;

depositing a third insulating layer over said over-lapping gate electrodes and over said first insulating layer;

forming contact openings in said third and first insulating layers to said first polysilicon layer, and thereby providing contact means to said source/drain areas;

depositing a second conducting layer on said third insulating layer and in said contact openings;

patterning said second conducting layer, leaving portions over said contact openings, and thereby completing said reverse self-aligned transistors having source/drain areas with said second conducting layer contacts.

18. The method of claim 1, wherein said first conducting layer is composed of cobalt silicide having a thickness of between about 100 to 800 Angstroms.

19. A reverse self-aligned field effect transistor, comprising:

a semiconductor substrate doped with a first conductive type dopant;

field oxide areas on said semiconductor substrate surrounding and electrically isolating device areas;

a patterned multilayer structure comprising in increasing elevation from said substrate a first conducting layer, a first polysilicon layer doped with a second conductive type dopant and a first insulating layer, wherein said first conducting layer is composed of cobalt silicide having a thickness of between about 100 and 300 Angstroms, and the thickness of said first polysilicon layer is between about 1000 and 2000 Angstroms;

said patterned multilayer structure having portions larger than and over said device areas and each of said portions having an opening with vertical sidewalls, said opening extending across and bisecting said portions of said patterned multilayer structure;

sidewall spacers formed from a second insulating layer on said vertical sidewalls in each said opening, and therefore the width between said sidewall spacers is narrower than the width of said opening;

a channel ion implant dopant of said first conductive type dopant in said substrate at exposed areas in said opening, thereby controlling the threshold voltage of said FET;

a gate oxide on the exposed surface of said substrate in said opening;

doped source and drain areas in portions of said device areas under said portions of said multilayer, said source and drain areas formed from out-diffusion of said second conductive type dopant from said first polysilicon layer through said first conductive layer;

a patterned conformal second polysilicon layer over said opening and doped with said second conductive type dopant, and thereby forming an overlapping gate electrode for said FET, wherein the thickness of said second polysilicon layer is between about 1500 and 2500 Angstroms;

a third insulating layer over said overlapping gate electrode and multilayer portions having said source/drain areas thereunder;

said third and first insulating layers having contact openings to said multilayer portions thereby providing contact means to said source/drain areas;

a patterned second conducting layer having portions over said contact openings, and thereby providing a completed said reverse self-aligned field effect transistor having said source/drain areas, said gate electrode and said second conducting layer contacts to said source and drain areas.

* * * * *